(12) United States Patent
Wang et al.

(10) Patent No.: US 9,034,713 B2
(45) Date of Patent: May 19, 2015

(54) METHOD OF FABRICATING HIGH VOLTAGE METAL-OXIDE-SEMICONDUCTOR TRANSISTOR DEVICE

(71) Applicant: UNITED MICROELECTRONICS CORP., Hsin-Chu (TW)

(72) Inventors: Chih-Chung Wang, Hsinchu (TW); Wei-Lun Hsu, Hsinchu County (TW); Shan-Shi Huang, Hsinchu (TW); Ke-Feng Lin, Taipei (TW); Te-Yuan Wu, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/548,248

(22) Filed: Nov. 19, 2014

(65) Prior Publication Data
US 2015/0079754 A1    Mar. 19, 2015

Related U.S. Application Data

(62) Division of application No. 13/216,276, filed on Aug. 24, 2011, now Pat. No. 8,921,937.

(51) Int. Cl.
| | |
|---|---|
| *H01L 29/78* | (2006.01) |
| *H01L 21/336* | (2006.01) |
| *H01L 29/66* | (2006.01) |
| *H01L 29/40* | (2006.01) |
| *H01L 29/06* | (2006.01) |

(Continued)

(52) U.S. Cl.
CPC ........ *H01L 29/66681* (2013.01); *H01L 29/402* (2013.01); *H01L 29/0619* (2013.01); *H01L 29/0878* (2013.01); *H01L 21/266* (2013.01); *H01L 21/0334* (2013.01); *H01L 29/66659* (2013.01)

(58) Field of Classification Search
CPC .............. H01L 29/0696; H01L 29/063; H01L 29/0634; H01L 29/0847; H01L 29/0852
USPC .................................................. 438/286–292
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |

(Continued)

OTHER PUBLICATIONS

Cheng Cheu Hsu, "Deep trench isolation method for high voltage device on bulk si wafer", Invention disclosure, May 5, 2009, pp. 1-49.

*Primary Examiner* — Cuong Q Nguyen
(74) *Attorney, Agent, or Firm* — Winston Hsu; Scott Margo (57) ABSTRACT

The present invention provides a method of fabricating a HV MOS transistor device, including forming a deep well in a substrate, and the deep well; forming a first doped region in the deep well, and the first doped region, wherein a doping concentration of the first doped region and a doping concentration of the deep well in at least one electric field concentration region has a first ratio, the doping concentration of the first doped region and the doping concentration of the deep well outside the electric field concentration region has a second ratio, and the first ratio is greater than the second ratio; and forming a high voltage well in the substrate, and forming a second doped region and a third doped region respectively in the deep well and in the high voltage well.

10 Claims, 6 Drawing Sheets

(51) Int. Cl.
*H01L 29/08* (2006.01)
*H01L 21/266* (2006.01)
*H01L 21/033* (2006.01)

(56) References Cited

U.S. PATENT DOCUMENTS

| | | | |
|---|---|---|---|
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,701,023 A | 12/1997 | Bulucea |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,368,785 B2 | 5/2008 | Chen |
| 7,427,552 B2 | 9/2008 | Jin |
| 8,163,619 B2 * | 4/2012 | Yang et al. ............ 438/286 |
| 8,269,305 B2 | 9/2012 | Yamaji |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0070369 A1 | 3/2008 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |

* cited by examiner

METHOD OF FABRICATING HIGH VOLTAGE METAL-OXIDE-SEMICONDUCTOR TRANSISTOR DEVICE

CROSS REFERENCE TO RELATED APPLICATIONS

This application is a divisional application of and claims the benefit of U.S. patent application Ser. No. 13/216,276, filed Aug. 24, 2011.

BACKGROUND OF THE INVENTION

1. Field of the Invention

The present invention relates to a high voltage metal-oxide-semiconductor (HV MOS) transistor device and a method of fabricating the same, and more particularly, to an M-type HV MOS transistor device and a method of fabricating the same.

2. Description of the Prior Art

High voltage metal-oxide-semiconductor (HV MOS) transistor devices have been broadly utilized in CPU power supplies, power management systems, AC/DC converters, LCD/plasma TV drivers, automobile electronic components, PC peripheral devices, small DC motor controllers, and other consumer electronic devices due to being capable of enduring the high voltage provided by the electrical power system and having switching characterize together.

The HV MOS transistor device of the prior art is a circular device. A top view of the drain of the HV MOS transistor device is a circular pattern, and a top view of the source of the HV MOS transistor device is a circular ring-shaped pattern that surrounds the drain and has the same center of the circular pattern. Also, the drain of the HV MOS transistor device generally is electrically connected to a high voltage end of a power source, such as over 800 volts, so a voltage endurance structure is disposed between the drain and the source to raise a breakdown voltage of the HV MOS transistor device, and the HV MOS transistor device can operate normally under high voltage environment.

Since the channel width of the circular HV MOS transistor device is determined by a circumference of a ring region between the source and the drain, if the increase of the turn-on current of the HV MOS transistor device is required, the radius of the circular HV MOS transistor device should be increased accordingly, but the area of the circular HV MOS transistor device is also widely increased. For this reason, track race HV MOS transistor devices and M-type HV MOS transistor devices have been developed to increase the turn-on current of the HV MOS transistor device and minimize the area of the HV MOS transistor device together.

However, the breakdown voltage of the M-type HV MOS transistor device is smaller than the breakdown voltage of the circular HV MOS transistor device. When the circular HV MOS transistor device, the track race HV MOS transistor device and the M-type HV MOS transistor device are integrated in a same integrated circuit chip together, the breakdown voltage of the chip is limited by the breakdown voltage of the M-type HV MOS transistor device so as to reduce voltage endurance ability of the whole chip.

As a result, to raise the breakdown voltage of the M-type HV MOS transistor device and simultaneously to optimize the breakdown voltage of the chip integrated with the M-type HV MOS transistor device and the circular HV MOS transistor device is objective in this field.

SUMMARY OF THE INVENTION

It is therefore an objective of the present invention to provide a high voltage metal-oxide-semiconductor (HV MOS) transistor device and a method of fabricating the same to increase a breakdown voltage of the M-type HV MOS transistor device so as to optimize a breakdown voltage of a chip integrated with M-type HV MOS transistor devices and circular HV MOS transistor devices.

According to a preferred embodiment, a HV MOS transistor device is disclosed. The HV MOS transistor device includes a substrate, a deep well, a first doped region, a high voltage well, a second doped region, a third doped region, a gate structure, and a fourth doped region. The substrate has a first conductive type, and the substrate has at least one electric field concentration region. The deep well is disposed in the substrate, and the deep well has a second conductive type different from the first conductive type. The first doped region is disposed in the deep well, wherein a doping concentration of the first doped region and a doping concentration of the deep well in the electric field concentration region has a first ratio, the doping concentration of the first doped region and the doping concentration of the deep well outside the electric field concentration region has a second ratio, and the first ratio is greater than the second ratio. The high voltage well is disposed in the deep well, and the high voltage well has the first conductive type. The second doped region is disposed in the deep well, and the second doped region has the second conductive type, wherein the first doped region is located between the second doped region and the high voltage well. The third doped region is disposed in the high voltage well, and the third doped region has the second conductive type, wherein the electric field concentration surrounds a part of the third doped region. The gate structure is disposed on the high voltage well between the first doped region and the third doped region. The fourth doped region is disposed in the high voltage well, and the fourth doped region has the first conductive type.

According to a preferred embodiment, a method of fabricating a HV MOS transistor device is disclosed. First, a substrate is provided, wherein the substrate has a first conductive type, and the substrate has at least one electric field concentration region. Next, a deep well is formed in the substrate, and the deep well has a second conductive type different from the first conductive type. Thereafter, a first doped region is formed in the deep well, and the first doped region has the first conductive type, wherein a doping concentration of the first doped region and a doping concentration of the deep well in the electric field concentration region has a first ratio, the doping concentration of the first doped region and the doping concentration of the deep well outside the electric field concentration region has a second ratio, and the first ratio is greater than the second ratio. Then, a high voltage well is formed in the substrate, and a second doped region and a third doped region are respectively formed in the deep well and in the high voltage well, and the high voltage well has the first conductive type. The second doped region and the third doped region have the second conductive type, wherein the first doped region is disposed between the second doped region and the high voltage well, and the electric field concentration region surrounds a part of the third doped region.

The breakdown voltage of the M-type HV MOS transistor device in the present invention can be increased by adjusting the first ratio of the doping concentration of the P-type first doped region to the doping concentration of the N-type deep well in each electric field concentration region to be greater than the second ratio of the doping concentration of the P-type first doped region to the doping concentration of the N-type deep well outside each electric field concentration region, and thus, the breakdown voltage of the chip integrated with the M-type HV MOS transistor device and the circular HV MOS transistor device can be effectively raised.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
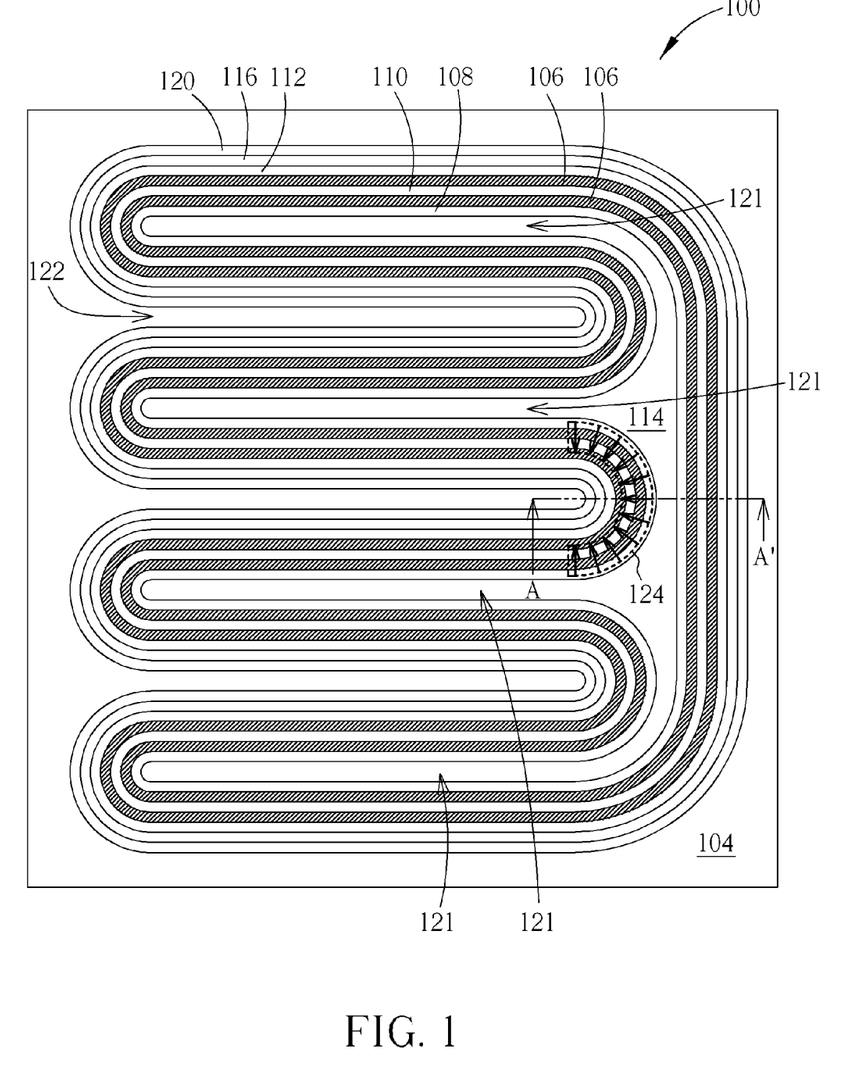
FIG. 1 is a schematic diagram illustrating a top view of a high voltage metal-oxide-semiconductor (HV MOS) transistor device according to a preferred embodiment of the present invention.
Figure 2:
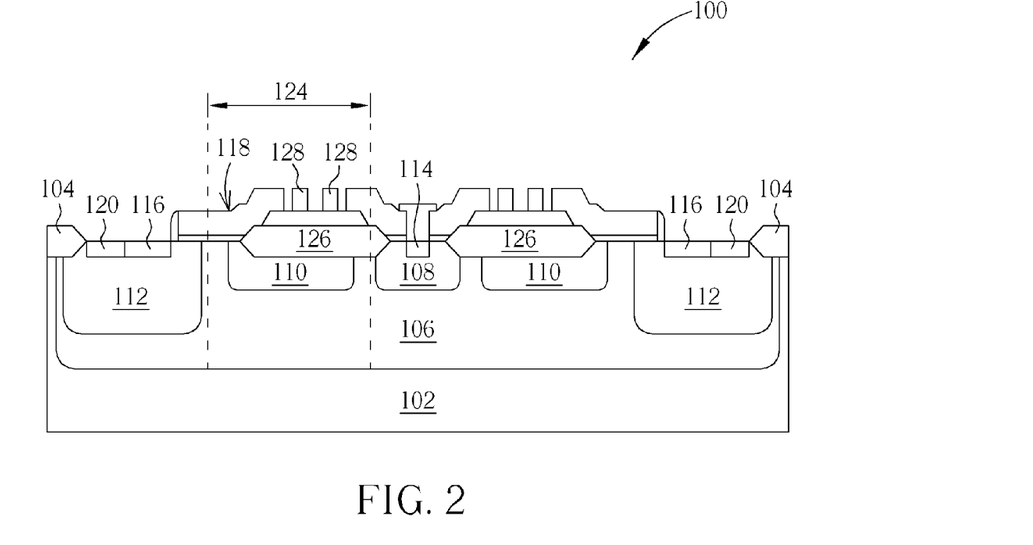
FIG. 2 is a schematic diagram illustrating a cross section of FIG. 1 along a cross-sectional line AA'.

Refer to FIG. 1 and FIG. 2. FIG. 1 is a schematic diagram illustrating a top view of a high voltage metal-oxide-semiconductor (HV MOS) transistor device according to a preferred embodiment of the present invention, and FIG. 2 is a schematic diagram illustrating a cross section of FIG. 1 along a cross-sectional line AA'. As shown in FIG. 1 and FIG. 2, the HV MOS transistor device 100 is fabricated on a substrate 102, such as a silicon substrate, and the substrate 102 has a first conductive type. The HV MOS transistor device 100 includes a first insulating layer 104, a deep well 106, a drift region 108, a first doped region 110, a high voltage region 112, a second doped region 114, a third doped region 116, a gate structure 118, and a fourth doped region 120. The deep well 106, the second doped region 114 and the third doped region 116 have a second conductive type different from the first conductive type, and the first doped region 110, the high voltage well 112 and the fourth doped region 120 have the first conductive type. The first conductive type and the second conductive type in this embodiment are respectively P type and N type. The present invention is not limited to this, and the first conductive type and the second conductive type also can be exchanged.

In this embodiment, the N-type deep well 106 is disposed in the P-type substrate 102, and serves as a drain of the HV MOS transistor device 100. The first insulating layer 104 is disposed on the P-type substrate 102, and is used to define a position of the N-type deep well 106. The N-type drift region 108 is disposed in the N-type deep well 106. The N-type second doped region 114 is disposed in the N-type drift region 108, and the N-type second doped region 114 has a plurality of protruding parts 121 extending toward a same direction and parallel to each other, so that any two of the protruding parts 121 have a concavity 122 there between. Accordingly, the N-type second doped region 114 is an M-shaped structure or comb-shaped structure, and is used to electrically connect the N-type deep well 106 to a drain metal, so that a high voltage generated from the power source can be transferred to the N-type deep well 106 by the drain metal. The P-type high voltage well 112 is disposed in the N-type deep well 106, and the N-type deep well 106 surrounds P-type high voltage region 112. In addition, the P-type high voltage well 112 surrounds the N-type second doped region 114 along the edge of the N-type second doped region 114 having the M-shaped structure so as to have an M-shaped ring structure. The P-type high voltage well 112 serves as a base of the HV MOS transistor device 100. The N-type third doped region 116 is disposed in the P-type high voltage well 112, and serves as a source of the HV MOS transistor device 100. The N-type third doped region 116 surrounds the N-type second doped region 114, and has the same M-shaped ring structure as the P-type high voltage well 112. The N-type fourth doped region 120 is disposed in the P-type high voltage well 112, and surrounds the N-type third doped region 114. The N-type fourth doped region 120 is used to electrically connect the P-type high voltage well 112 serving as the base of the HV MOS transistor device 100 to the outside. The gate structure 118 is disposed on the P-type high voltage well 112 between the P-type first doped region 110 and the N-type third doped region 116, and serves as a gate of the HV MOS transistor device 100. The P-type first doped region 110 is disposed in the N-type deep well 106 between the N-type second doped region 114 and the P-type high voltage well 112, and surrounds the N-type second doped region 114. The P-type first doped region 110 can be used to increase a voltage endurance ability of the N-type deep well 106 between the N-type second doped region 114 and the P-type high voltage well 112, and the N-type deep well 106 can be avoided breaking down due to over high voltage. As a result, the HV MOS transistor device 100 in this embodiment is an M-type device or a comb-shaped device having a plurality of the concavities 122. The HV MOS transistor device 100 of the present invention is not limited to have a plurality of concavities 122, and also can have at least one concavity 122.

In addition, the substrate 102 has a plurality of electric field concentration region 124 defined thereon. Each electric field concentration region 124 is disposed between the N-type second doped region 114 and the P-type high voltage well 112, and is located at a bottom of each concavity 122. Furthermore, each electric field concentration region 124 is a semicircular arc-shaped region, and surrounds a part of the N-type third doped region 116. The number of the electric field concentration region 124 in the present invention is determined by the number of the concavities 122, so the substrate 102 of the present invention is not limited to have a plurality of the electric field concentration region 124, and also can have at least one electric field concentration region 124. In this embodiment, a doping concentration of the P-type first doped region 110 and a doping concentration of the N-type deep well 106 in each electric field concentration region 124 have a first ratio, and a doping concentration of the P-type first doped region 110 and a doping concentration of the N-type deep well 106 outside each electric field concentration region 124 have a second ratio. Furthermore, the doping concentration of the N-type deep well 106 in each electric field concentration region 124 is less than the doping concentration of the N-type deep well 106 outside each electric field concentration region 124, so that the first ratio is greater than the second ratio. Moreover, the doping concentration of the P-type first doped region 110 in each electric field concentration region 124 should be adjusted according to the doping concentration of the N-type deep well 106 in each electric field concentration region 124 so as to have a suitable first ratio, and the HV MOS transistor device 100 can have a required function of operation. In addition, the doping concentration of the N-type deep well 106 in each electric field concentration region 124 adjacent to two sides of the P-type first doped region 110 is less than the doping concentration of the N-type deep well 106 in each electric field concentration region 124 away from the sides of the P-type first doped region 110. In other words, in each electric field concentration region 124, the doping concentration of the N-type deep well 106 adjacent to the inside and the outside of each electric field concentration region 124 is greater than the doping concentration of the N-type deep well 106 away from the inside and the outside of each electric field concentration region 124, and the closer to the inside and the outside of each electric field concentration region 124 the N-type deep well 106 is, the less doping concentration the N-type deep well 106 has. The present invention is not limited herein. In other embodiments of the present invention, the N-type deep well 106 only closer to the inside of teach electric field concentration region 124 or only closer to the outside of teach electric field concentration region 124 has the less doping concentration. Or, the doping concentration of the N-type deep well 106 in each electric field concentration region 124 also can have no gradient variance.

It should be noted that when the HV MOS transistor device 100 is turned on, a high electric field is generated between the N-type second doped region 114 electrically connected to the high voltage and the N-type third doped region 116 serving as the source, and the direction of the electric field is from the N-type second doped region 114 to the N-type third doped region 116. Since each electric field concentration region 124 is the semicircular arc-shaped region, a length of an outside of each electric field concentration region 124 is greater than a length of an inside of the each electric field concentration region 124. Thus, the electric field in each electric field concentration region 124 is concentrated from the outside of each electric field concentration region 124 to the inside of each electric field concentration region 124, as arrows shown in FIG. 1. For this reason, the P-type first doped region 110 and the N-type deep well 106 in each electric field concentration region 124 endure higher voltage density than the P-type first doped region 110 and the N-type deep well 106 outside each electric field concentration region 124. The voltage endurance ability of the HV MOS transistor device 100 in this embodiment is increased by adjusting the first ratio to be greater than the second ratio so as to avoid the P-type first doped region 110 and the N-type deep well 106 in each electric field concentration region 124 breaking down first due to the HV MOS transistor device 100 being driven over high voltage. The breakdown voltage of the HV MOS transistor device 100 can be increased accordingly. In this embodiment, the doping concentration of the N-type deep well 106 in each electric field concentration region 124 adjacent to the P-type high voltage well 112 is less than the doping concentration of the N-type deep well 106 in each electric field concentration region 124 away from the P-type high voltage well 112, so that the breakdown voltage of the N-type deep well 106 having more concentrated electric field in each electric field concentration region 124 can be increased by doping lighter doping concentration.

Additionally, the HV MOS transistor device 100 further includes a second insulating layer 126 and a plurality of field plates 128. The second insulating layer 126 is disposed on the P-type first doped region 110 and used to avoid the high voltage of the N-type second doping region breaking the gate structure 118. The field plates 128 are disposed on the second insulating layer 126, and are floated, so that the field plates can be used to raise the breakdown voltage of the HV MOS transistor device 110.

Figure 3:
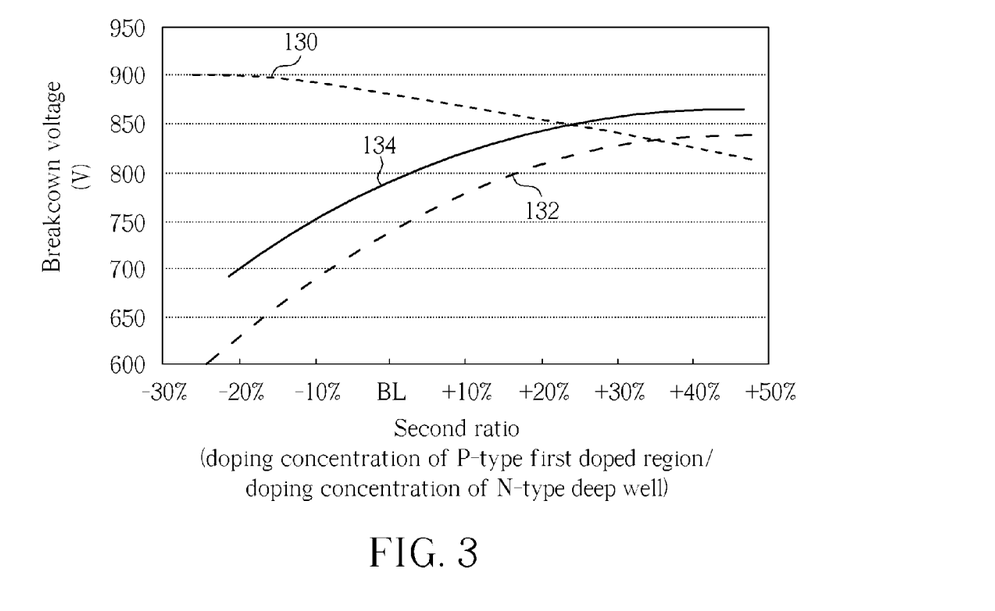
FIG. 3 is a schematic diagram illustrating correlations between the second ratio of the doping concentration of the P-type first doped region to the doping concentration of the N-type deep well outside each electric field concentration region and the breakdown voltage of different HV MOS transistor devices.

Refer to FIG. 3, which is a schematic diagram illustrating correlations between the second ratio of the doping concentration of the P-type first doped region to the doping concentration of the N-type deep well outside each electric field concentration region and the breakdown voltage of different HV MOS transistor devices. As shown in FIG. 3, a first correlation curve 130 represents a correlation of the second ratio to the breakdown voltage of a circular HV MOS transistor device. A second correlation curve 132 represents a correlation of the second ratio to the breakdown voltage of an M-type HV MOS transistor device when the first ratio of the doping concentration of the P-type first doped region to the doping concentration of the N-type deep well in each electric field concentration region is the same as the second ratio. A third correlation curve 134 represents a correlation of the second ratio to the breakdown voltage of the M-type HV MOS transistor device according to the above-mentioned embodiment when the first ratio is greater than the second ratio. Comparing the second correlation curve 132 and the third correlation curve 134, the breakdown voltage of the third correlation curve 134 is greater than the breakdown voltage of the second correlation curve 132 under the same second ratio. In other words, when the first ratio is adjusted to be greater then the second ratio in the M-type HV MOS transistor device, the second correlation curve 132 will be shifted toward to become the third correlation curve 134. In addition, it should be noted that the breakdown voltage of the circular HV MOS transistor device gradually decreases with the increase of the second ratio in the first correlation curve 130, but the breakdown voltage of the M-type HV MOS transistor device gradually increases with the increase of the second ratio in the second correlation curve 132 and the third correlation curve 134. For this reason, the M-type HV MOS transistor device in this embodiment increases the breakdown voltage by adjusting the first ratio to be greater than the second ratio under the same second ratio. Thus, the breakdown voltage at an intersection point of the first correlation curve 130 and the third correlation curve 134 is larger than the breakdown voltage at an intersection point of the first correlation curve 130 and the second correlation curve 134. Furthermore, the second ratio at the intersection of the first correlation curve 130 and the third correlation curve 134 is closer to a standard value BL than the second ratio at the intersection of the first correlation curve 130 and the second correlation curve 132. Accordingly, the HV MOS transistor device can be avoided abnormally operation resulted from the second ratio deviating from the standard value too large. Therefore, a breakdown voltage of a chip integrated with the M-type HV MOS transistor device and the circular HV MOS transistor device can be effectively increased.

Figure 4:
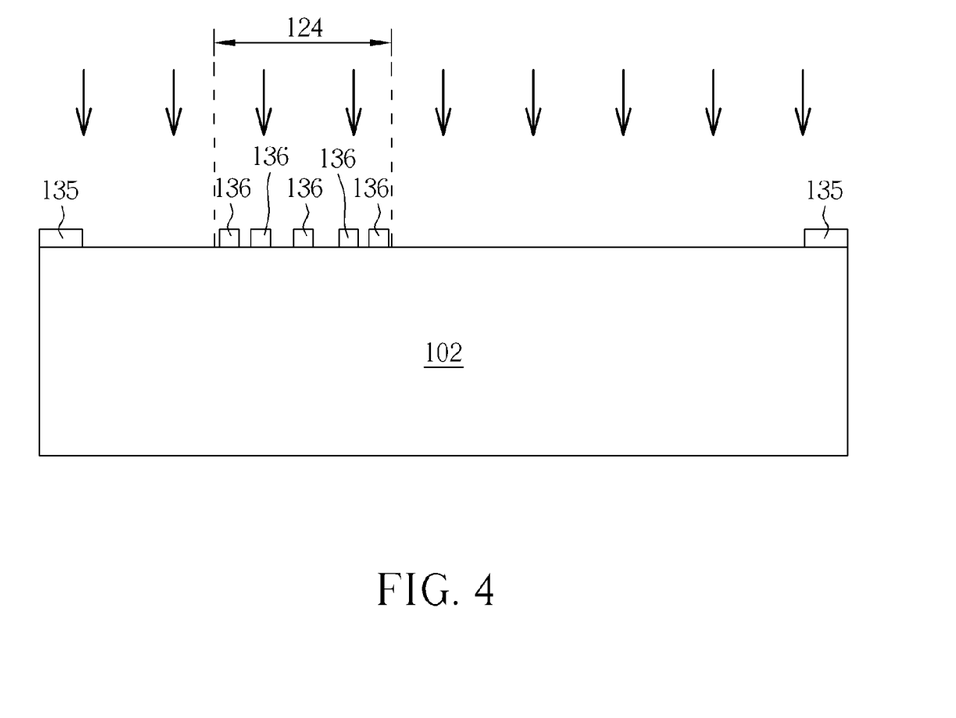
FIG. 4 through FIG. 9 are schematic diagrams illustrating a method of fabricating the HV MOS transistor device according to a preferred embodiment of the present invention.
Figure 5:
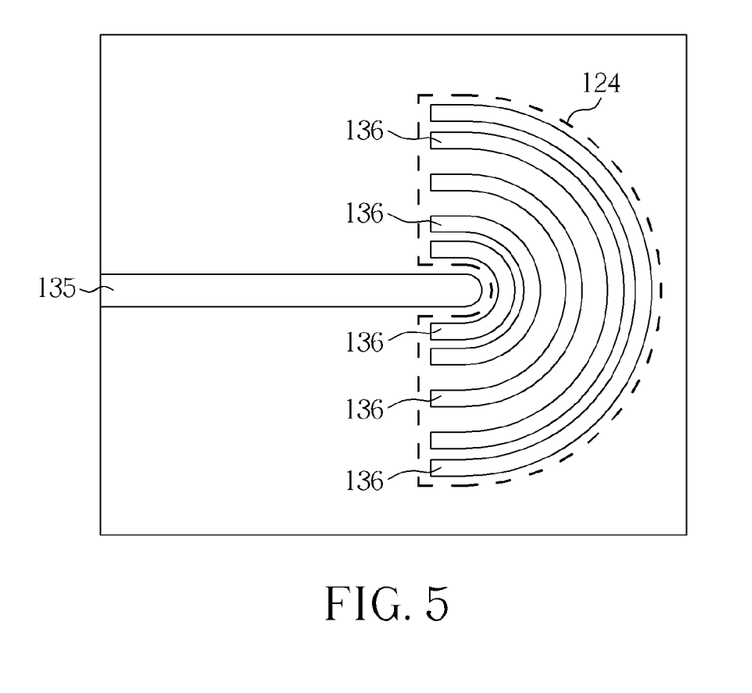
Figure 6:
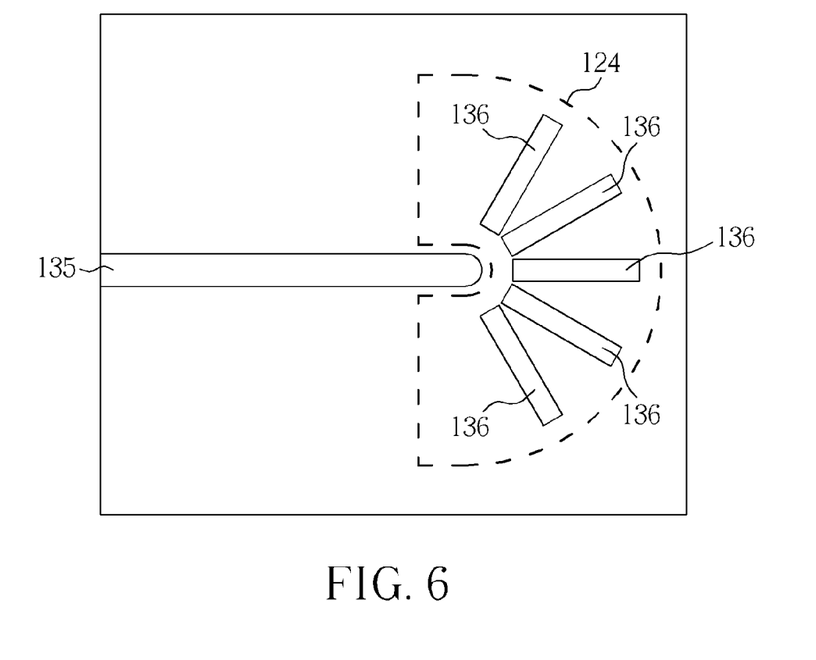

The following description further details a method of fabricating the HV MOS transistor device of this embodiment. Refer to FIG. 4 through FIG. 9 together with FIG. 2. FIG. 4 through FIG. 9 are schematic diagrams illustrating a method of fabricating the HV MOS transistor device according to a preferred embodiment of the present invention. As shown in FIG. 4, the P-type substrate 102 is provided first. Next, a first mask 135 and a plurality of second masks 136, such as photoresist mask, are formed on the P-type substrate 102. The first mask 135 defines a position of the N-type deep well 106, and the second masks 136 are disposed in each electric field concentration region 124. Thereafter, a first ion implantation process is performed conformally on the P-type substrate 102 to implant N-type ions into the P-type substrate 102. As shown in FIG. 5, each second mask 136 of this embodiment is a circular arc-shaped mask, and each second mask 136 surrounds the inside of each electric field concentration region 124. The second masks 136 in each electric field concentration region 124 are arranged from the inside of each electric field concentration region 124 to the outside of each electric field concentration region 124. It should be noted that any two of the second masks 136 have a space, and the spaces adjacent to the inside and an outside of the electric field concentration region 124 is less than the spaces away from the inside and the outside of the electric field concentration region 124. Accordingly, the doping concentration of the N-type deep well 106 formed in each electric field concentration region 124 adjacent to two sides of the formed P-type first doped region 110 in the following steps is less than the doping concentration of the N-type deep well 106 formed in each electric field concentration region 124 away from the sides of the formed P-type first doped region 110, and the breakdown voltage of the N-type deep well 106 having more concentrated electric field in each electric field concentration region 124 that is the N-type deep well 106 adjacent to the two sides of the P-type doped region 110 can be increased by doping lighter doping concentration. The second mask 136 of the present invention is not limited to be a circular arc-shaped mask, and each second mask 136 also can be a strip-shaped mask, and each second mask 136 in each electric field concentration region 124 directs toward the inside of an inside of each electric field concentration region 124. Accordingly, the doping concentration of the N-type deep well 106 formed in each electric field concentration region 124 adjacent to the inside of the formed P-type first doped region 110 in the following steps is less than the doping concentration of the N-type deep well 106 formed in each electric field concentration region 124 away from the inside of the formed P-type first doped region 110. The present invention is not limited to this, and the doping concentration of the N-type deep well 106 in each electric field concentration region 124 can have gradient variance or no gradient variance by adjusting the spaces between any two of the second masks 136 or widths and shapes of the second masks 136 according to the requirement of voltage tolerance.

Figure 7:
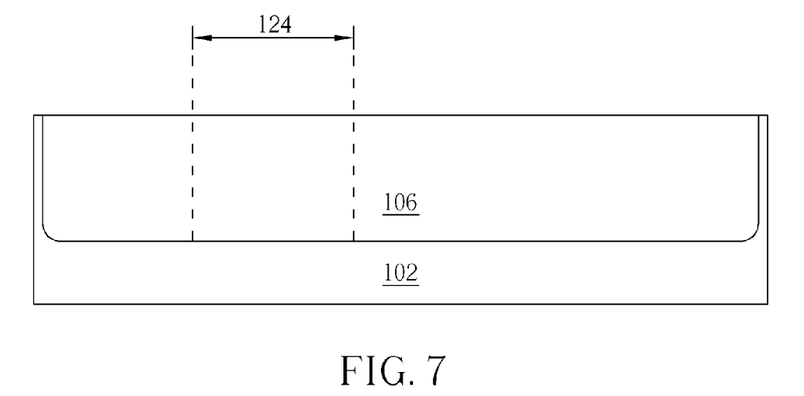

As shown in FIG. 7, the first mask 135 and the second masks 136 are removed thereafter, and a thermal drive-in process is performed to form the N-type deep well 106. Since the second masks 136 shield a part of P-type substrate 102 of each electric field concentration region 124, the concentration of the N-type ions doped in each electric field concentration region 124 is less than the concentration of the N-type ions doped outside each electric field concentration region 124. Accordingly, the doping concentration of the N-type deep well 106 in each electric field concentration region 124 can be less than the doping concentration of the N-type deep well 106 outside each electric field concentration region 124.

Figure 8:
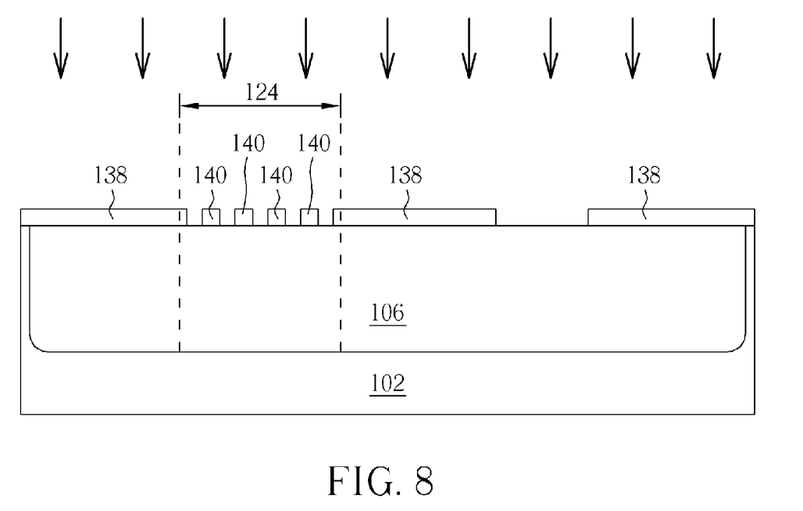
Figure 9:
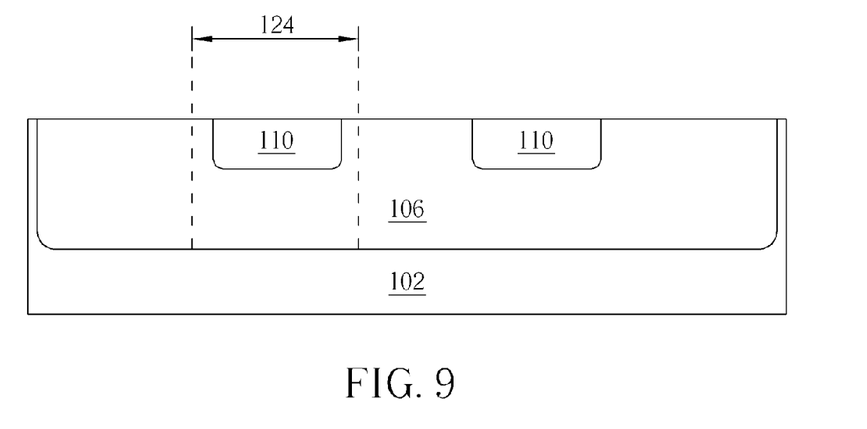

As shown in FIG. 8, a third mask 138 and a plurality of fourth masks 140, such as photoresist mask, are then formed simultaneously on the P-type substrate 102. The third mask 138 defines the position of the P-type first doped region 110, and the fourth masks 140 are disposed in each electric field concentration region 124. Thereafter, a second ion implantation process is performed conformally on the P-type substrate 102 to implant P-type ions into the N-type deep well 106. As shown in FIG. 9, next, the third mask 138 and the fourth masks 140 are removed, and a thermal drive-in process is performed to form the P-type first doped region 110. Since the fourth masks 140 shield a part of the N-type deep well 106 in each electric field concentration region 124, the concentration of the P-type ions doped in each electric field concentration region 124 is less than the concentration of the P-type ions doped outside each electric field concentration region 124. The concentration of the P-type ions doped in each electric field concentration region 124 is matched with the doping concentration of the N-type deep well 106 in each electric field concentration region 124 so as to have the suitable first ratio. Furthermore, the HV MOS transistor device 100 can have a required function of operation, and the first ratio of the doping concentration of the P-type first doped region 110 to the doping concentration of the N-type deep well 106 in each electric field concentration region 124 is greater than the second ratio of the doping concentration of the P-type first doped region 110 to the doping concentration of the N-type deep well 106 outside each electric field concentration region 124. Since the concentration of the P-type ions in each electric field concentration region 124 is not limited to be less than the concentration of the P-type ions outside each electric field concentration region 124, the method of the present invention is not limited to form the fourth masks 140 on the P-type substrate 102, and also can form no fourth masks 140, so that the doping concentration of the P-type first doped region 110 in each electric field concentration region 124 is the same as the doping concentration of the P-type first doped region outside each electric field concentration region 124. The first ratio also can be greater than the second ratio. The present invention is not limited herein.

As shown in FIG. 2, next, the P-type high voltage well 112 and the N-type drift region 108 are sequentially formed in the N-type deep well 106. Then, the second insulating layer 126, such as field oxide layer, is formed on the P-type first doped region 110. Subsequently, the gate structure 118 and the field plates 128 are formed on the P-type high voltage well 112, the N-type deep well 106 and the second insulating layer 126. The gate structure 118 extends from a part of the P-type high voltage well 112 to a part of the second insulating layer 126. Then, the N-type second doped region 114 is formed in the N-type drift region 108, and the N-type third doped region 116 is simultaneously formed in the P-type high voltage well 112. The P-type first doped region 110 is located between the N-type second doped region 114 and the P-type high voltage well 112, and each electric field concentration region 124 surrounds a part of the N-type third doped region 116. Next, the P-type fourth doped region 120 is formed in the P-type high voltage well 112.

Figure 10:
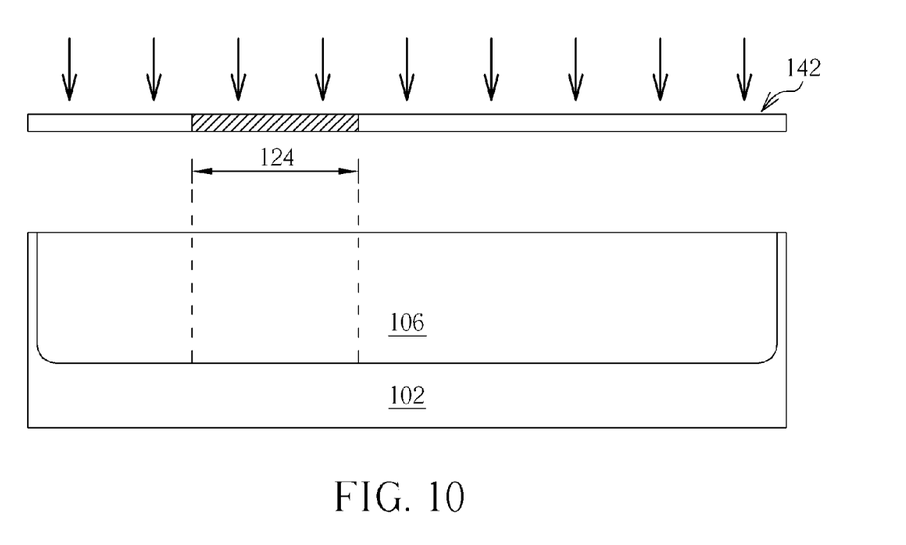
FIG. 10 is a schematic diagram illustrating a method of fabricating the HV MOS transistor device according to another preferred embodiment of the present invention.

The method of forming the N-type deep well having different doping concentration in the present invention is not limited to use the photoresist masks. Refer to FIG. 10, which is a schematic diagram illustrating a method of fabricating the HV MOS transistor device according to another preferred embodiment of the present invention. As shown in FIG. 10, as compared with the above-mentioned embodiment, the step of forming the N-type deep well in this embodiment includes performing the first ion implantation process with a halftone mask 142, and the halftone mask 142 corresponds a region outside each electric field concentration 124. Accordingly, the concentration of the N-type ions doped in each electric field concentration region 124 is less than the concentration of the N-type ions doped outside each electric field concentration region 124. Thus, the doping concentration of the N-type deep well 106 in each electric field concentration region 124 can be less than the doping concentration of the N-type deep well 106 outside each electric field concentration region 124. Furthermore, in other embodiments of the present invention, the step of forming the P-type first doped region 110 with different doping concentration also can utilize the halftone mask 142, but is not limited herein.

In summary, the present invention uses circular arc-shaped or strip-shaped masks or a halftone mask to shield a part of P-type substrate in each electric field concentration region so as to form the N-type deep well having different doping concentration, and the doping concentration of the N-type deep well in each electric field concentration region is thus less than the doping concentration of the N-type deep well outside each electric field concentration region. Accordingly, the first ratio of the doping concentration of the P-type first doped region to the doping concentration of the N-type deep well in each electric field concentration region can be greater than the second ratio of the doping concentration of the P-type first doped region to the doping concentration of the N-type deep well outside each electric field concentration region. In addition, the breakdown voltage of the M-type HV MOS transistor device in the present invention can be increased by adjusting the first ratio to be greater than the second ratio, and thus, the breakdown voltage of the chip integrated with the M-type HV MOS transistor device and the circular HV MOS transistor device can be effectively raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a HV MOS transistor device, comprising:
    providing a substrate, wherein the substrate has a first conductive type, and the substrate has at least one electric field concentration region;
    forming a deep well in the substrate, and the deep well having a second conductive type different from the first conductive type;
    forming a first doped region in the deep well, and the first doped region having the first conductive type, wherein a doping concentration of the first doped region and a doping concentration of the deep well in the electric field concentration region has a first ratio, the doping concentration of the first doped region and the doping concentration of the deep well outside the electric field concentration region has a second ratio, and the first ratio is greater than the second ratio; and
    forming a high voltage well in the substrate, and forming a second doped region and a third doped region respectively in the deep well and in the high voltage well, the high voltage well having the first conductive type, and the second doped region and the third doped region having the second conductive type, wherein the first doped region is disposed between the second doped region and the high voltage well, and the electric field concentration region surrounds a part of the third doped region.

2. The method of fabricating the HV MOS transistor device according to claim 1, wherein the step of forming the deep well comprising:
    forming a first mask and a plurality of second masks on the substrate, wherein the second masks are disposed in the electric field concentration region; and
    performing a first ion implantation process conformally on the substrate to form the deep well, so that the doping concentration of the deep well in the electric field concentration region is less than the doping concentration of the deep well outside the electric field concentration region.

3. The method of fabricating the HV MOS transistor device according to claim 2, wherein each second mask is a circular arc-shaped mask, and each second mask surrounds an inside of the electric field concentration region.

4. The method of fabricating the HV MOS transistor device according to claim 3, wherein any two of the adjacent second masks has a space, and the spaces adjacent to the inside and an outside of the electric field concentration region is less than the spaces away from the inside and the outside of the electric field concentration region.

5. The method of fabricating the HV MOS transistor device according to claim 2, wherein each second mask is a strip-shaped mask, and each second mask directs toward an inside of the electric field concentration region.

6. The method of fabricating the HV MOS transistor device according to claim 1, wherein the step of forming the deep well comprises performing a first ion implantation process with a halftone mask, so that the doping concentration of the deep well in the electric field concentration region is less than the doping concentration of the deep well outside the electric field concentration region.

7. The method of fabricating the HV MOS transistor device according to claim 1, wherein the step of forming the first doped region comprises:
    forming a third mask and a plurality of fourth masks on the substrate, wherein the fourth masks are disposed in the electric field concentration region; and
    performing a second ion implantation process conformally on the substrate to form the first doped region.

8. The method of fabricating the HV MOS transistor device according to claim 1, further comprising forming a fourth doped region in the high voltage region, and the fourth doped region having the first conductive type.

9. The method of fabricating the HV MOS transistor device according to claim 1, further comprising forming an insulating layer on the first doped region.

10. The method of fabricating the HV MOS transistor device according to claim 9, further comprising forming a gate structure and a plurality of field plates on the insulating layer.

* * * * *